(12) United States Patent
Chiu et al.

(10) Patent No.: US 9,136,109 B2
(45) Date of Patent: Sep. 15, 2015

(54) SACRIFICIAL OXIDE WITH UNIFORM THICKNESS

(71) Applicant: Taiwan Semiconductor Manufacturing CO., LTD., Hsinchu (TW)

(72) Inventors: Yi-Wei Chiu, Kaohsiung (TW); Hsin-Yi Tsai, Tainan (TW); Tzu-Chan Weng, Kaohsiung (TW); Li-Te Hsu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 4 days.

(21) Appl. No.: 14/177,939

(22) Filed: Feb. 11, 2014

(65) Prior Publication Data

US 2015/0228472 A1    Aug. 13, 2015

(51) Int. Cl.
| | |
|---|---|
| *H01L 21/31* | (2006.01) |
| *H01L 21/469* | (2006.01) |
| *H01L 21/02* | (2006.01) |
| *H01L 21/265* | (2006.01) |
| *H01L 29/66* | (2006.01) |
| *H01L 29/78* | (2006.01) |

(52) U.S. Cl.
CPC .......... *H01L 21/022* (2013.01); *H01L 21/0214* (2013.01); *H01L 21/2652* (2013.01); *H01L 29/66568* (2013.01); *H01L 29/78* (2013.01)

(58) Field of Classification Search
CPC ............ H01L 21/3144; H01L 21/3145; H01L 21/2818; H01L 21/823418; H01L 21/823814; H01L 29/518
See application file for complete search history.

(56) References Cited

U.S. PATENT DOCUMENTS

2015/0093861 A1*  4/2015  Loubet et al. ................. 438/154

* cited by examiner

*Primary Examiner* — Hoai V Pham
(74) *Attorney, Agent, or Firm* — Servilla Whitney LLC

(57) ABSTRACT

A semiconductor device includes a silicon-based substrate, a gate structure and a laminated sacrificial oxide layer. The gate structure is on the silicon-based substrate. The laminated sacrificial oxide layer has a first portion on the silicon-based substrate and a second portion conformal to the gate structure, in which a first thickness of the first portion is substantially the same as a second thickness of the second portion. The laminated sacrificial oxide layer includes a native oxide layer and a silicon oxy-nitride layer. The native oxide layer is on the silicon-based substrate and conformal to the gate structure. The silicon oxy-nitride layer is conformal to the native oxide layer.

20 Claims, 17 Drawing Sheets

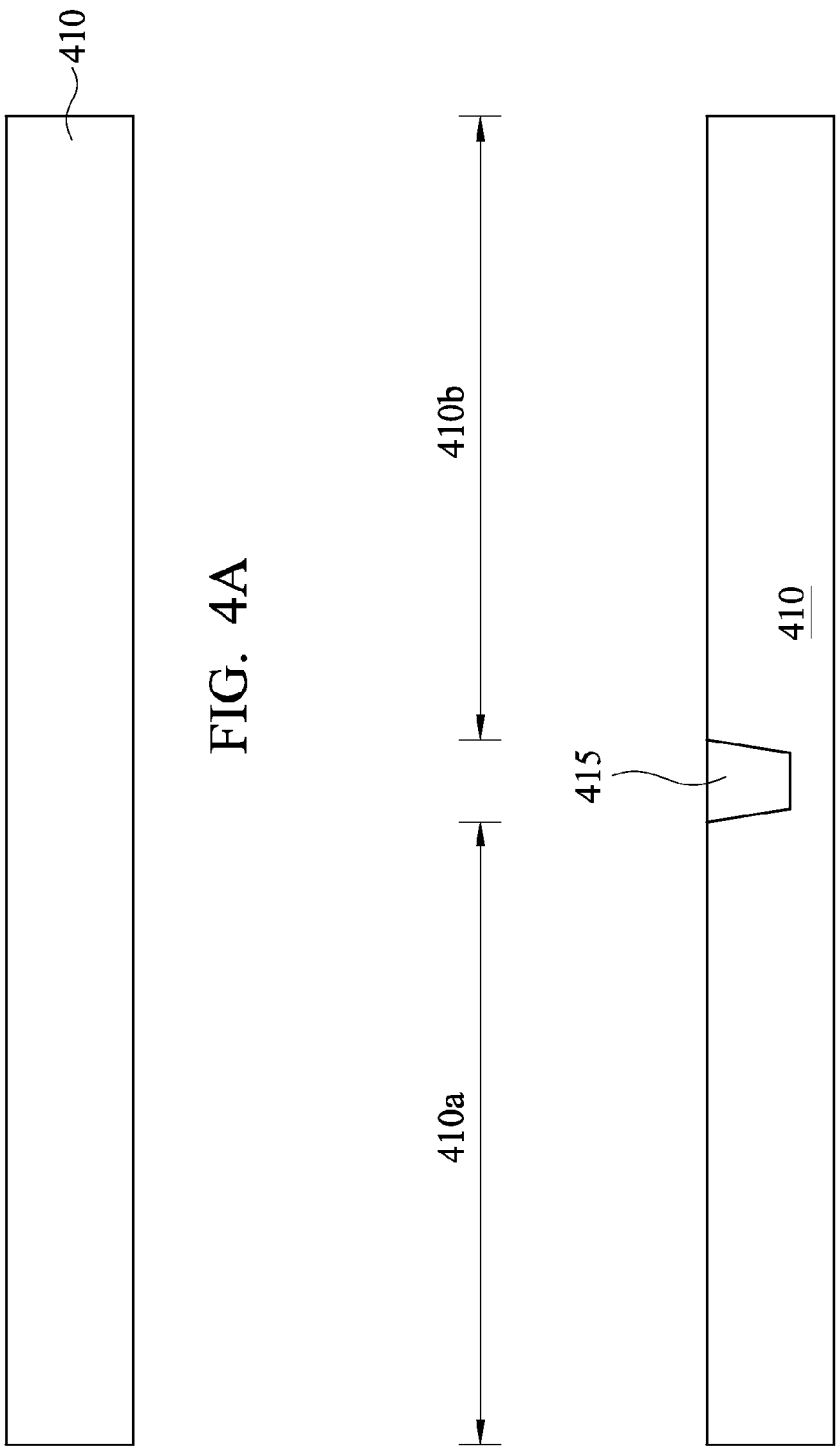

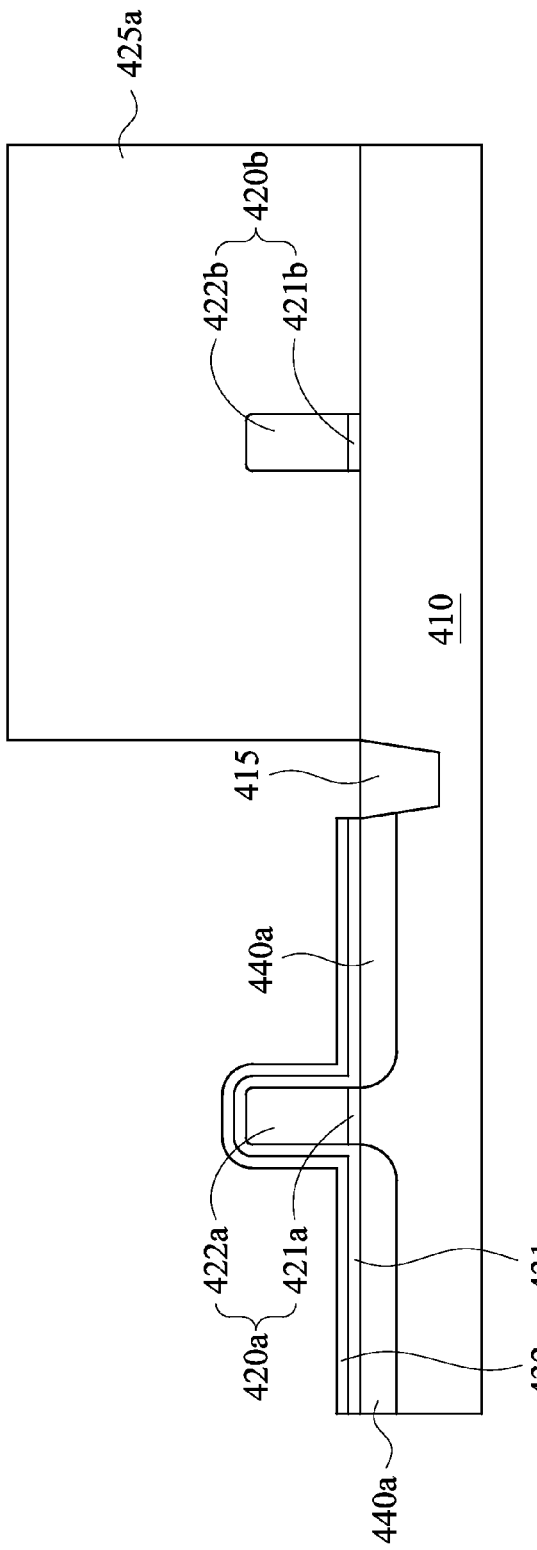
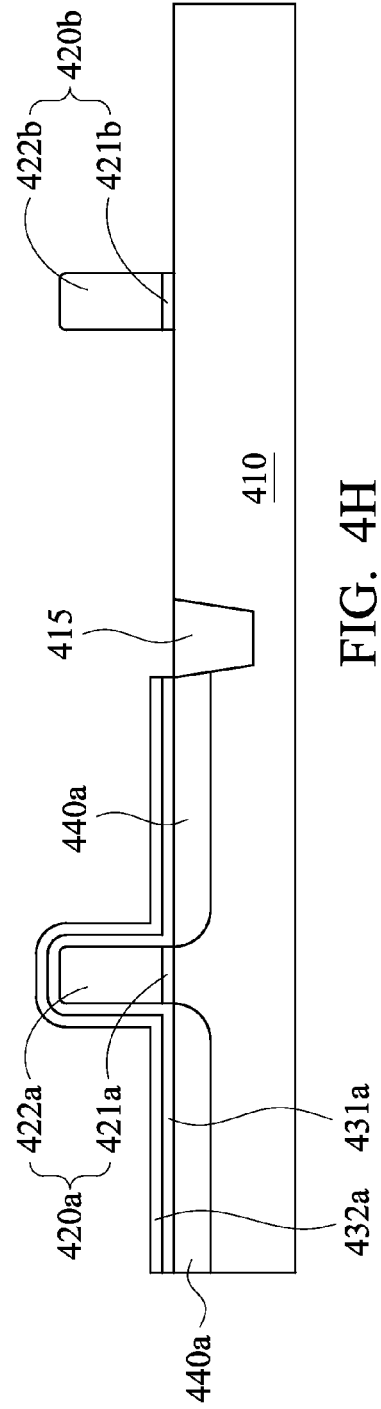
FIG. 4G
FIG. 4H

SACRIFICIAL OXIDE WITH UNIFORM THICKNESS

BACKGROUND

Complementary metal-oxide-semiconductor (CMOS) technology is a dominant semiconductor technology used for the manufacture of ultra-large scale integrated (ULSI) circuits today. However, the fabrication of CMOS devices faces significant challenges. One of the challenges resides in the fabrication of implanted regions, such as source/drain regions, an n-well or a p-well. In order to fabricate the implanted regions using different types of ions, a sacrificial oxide layer is first deposited on a substrate, and then a resist layer is deposited and patterned on the sacrificial oxide layer to expose predetermined positions of the substrate, thereby implanting ions at the predetermined positions but not at other positions of the substrate. Then, the patterned resist layer is removed. Thereafter, the aforementioned process is repeated to form other implanted regions using other types of ions. Generally, the resist layer is patterned by using a dry etching process. However, the sacrificial oxide layer is often damaged by the dry etching process, thus causing the sacrificial oxide layer to have non-uniform thickness. Thus, due to the non-uniform thickness of the sacrificial oxide layer, and the ion are implanted in different depths of the substrate, which is detrimental to controlling the stability of ion implantation.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 4A-4M are schematic cross-sectional views of intermediate stages showing a method for fabricating a semiconductor device in accordance with certain embodiments;

DETAILED DESCRIPTION

Figure 1:
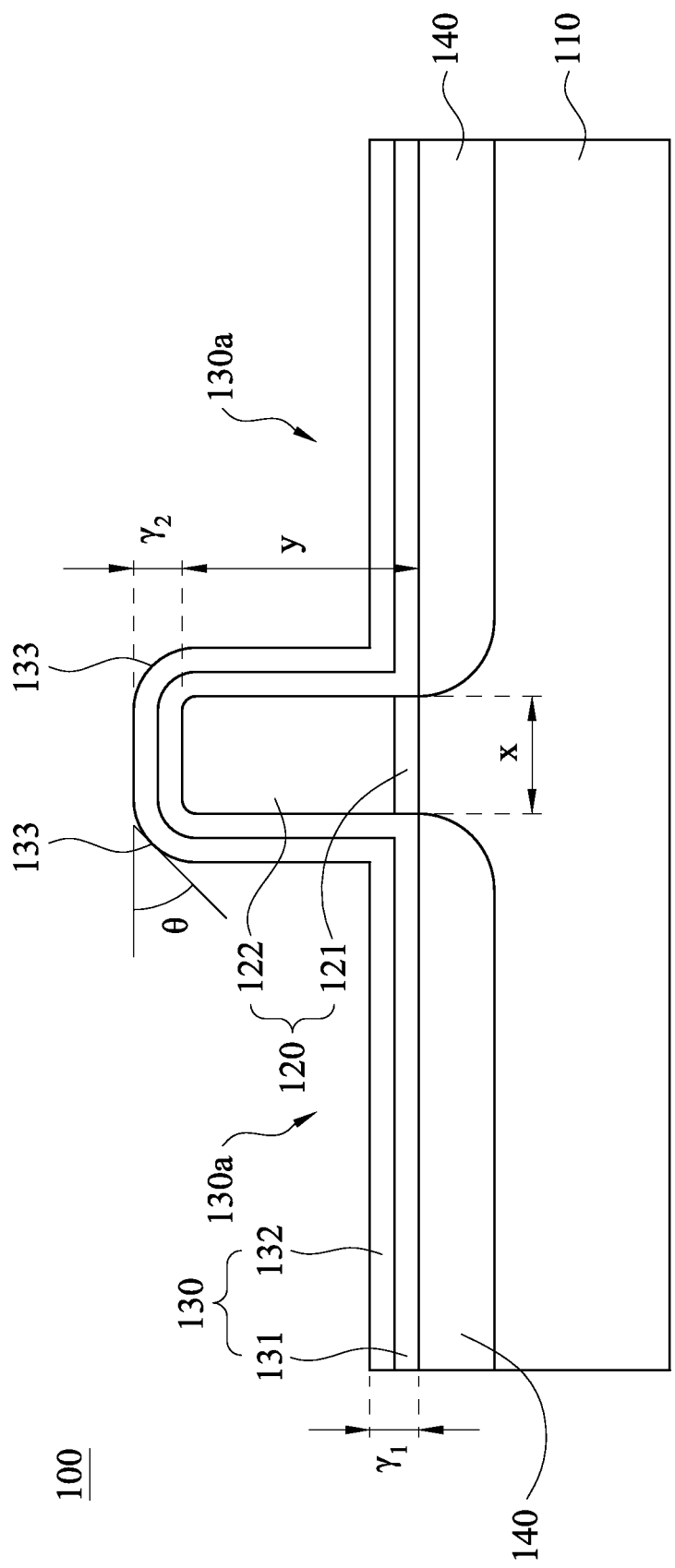
FIG. 1 is a schematic cross-sectional diagram of a semiconductor device in accordance with some embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

Embodiments of the present disclosure provide a semiconductor device (such as an image sensor or a logic device) with a laminated sacrificial oxide layer (including a native oxide layer and a silicon oxy-nitride layer) or a silicon oxy-nitride layer (used as a sacrificial oxide layer) which is formed after a drying etching process for patterning a resist layer is performed, so as to prevent or at least improve, the problem of the non-uniform thickness of the sacrificial oxide layer.

According to various embodiments of the present disclosure, the semiconductor device may include a gate structure with an aspect ratio greater than about 0% and smaller than or equal to about 40%, in which the aspect ratio is the ratio of the width of the gate structure to its height. The aforementioned sacrificial oxide layer is not formed by deposition but by using a reactive gas to convert the native oxide layer to the silicon oxy-nitride layer. The gate structure with a greater height may be formed without needing to consider the problem of step coverage induced by deposition.

FIG. 1 is a schematic cross-sectional diagram of a semiconductor device 100 in accordance with some embodiments. As shown in FIG. 1, the semiconductor device 100 includes a silicon-based substrate 110, a gate structure 120, and a laminated sacrificial oxide layer 130.

In some embodiments, the silicon-based substrate 110 is formed from, for example, pure silicon. Other commonly used materials, such as carbon, germanium, silicon-germanium, gallium, arsenic, nitrogen, indium, phosphorus, and/or the like, may also be included in the silicon-based substrate 110. The silicon-based substrate 110 may be formed from a single-crystalline silicon-based material or compound silicon-based materials, and may be a bulk substrate or a semiconductor-on-insulator (SOI) substrate.

In some embodiments, the gate structure 120 is formed on the silicon-based substrate 110, and may include a gate dielectric layer 121 and a gate electrode 122. The gate dielectric layer 121 includes a dielectric material, such as silicon oxide, high-k dielectric material, silicon-based material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode 122 includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 120 may include numerous other layers, for example, capping layers, interface layers, diffusion layers, barrier layers, or combinations thereof. The gate structure 120 is formed by a process including deposition, lithography patterning, and/or etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable lithography patterning processes, or combinations thereof. Alternatively, the lithography patterning process is implemented or replaced by other methods, such as maskless photolithography, electron-beam writing, and/or ion-beam writing. In alternative embodiments, the lithography patterning process could implement nanoimprint technology. The etching processes include dry etching, wet etching, and/or other etching methods.

In some embodiments, the laminated sacrificial oxide layer 130 has a first portion 130a on the silicon-based substrate 110 and a second portion 130b conformal to the gate structure 120, in which a first thickness $\gamma_1$ of the first portion 130a is substantially the same as a second thickness $\gamma_2$ of the second portion 130b. In some embodiments, the first thickness $\gamma_1$ and the second thickness $\gamma_2$ are in a range from about 10 angstroms to about 22 angstroms.

In some embodiments, the laminated sacrificial oxide layer 130 includes a native oxide layer 131 and a silicon oxy-nitride layer 132. The native oxide layer 131 is formed on the silicon-based substrate 110 and conformal to the gate structure 120, and the silicon oxy-nitride layer 132 is conformal to the native oxide layer 131. In some embodiments, the laminated sacrificial oxide layer 130 is formed using the following operations. At first, the native oxide layer 131 is formed by exposing the silicon-based substrate 110 and the gate structure 120 in an air or oxygen atmosphere. Thereafter, a reactive gas, including such as hydrogen gas (or oxygen gas) and nitrogen gas, is used to convert a portion of the native oxide layer 131 to the silicon oxy-nitride layer 132. The hydrogen gas (or the oxygen gas) is used to break the bonding between silicon atoms and oxide atoms of the native oxide layer 131, and the nitrogen gas is used to provide nitrogen atoms for converting the native oxide layer 131 to the silicon oxy-nitride layer 132. In certain embodiments, the laminated sacrificial oxide layer 130 may be replaced by one single layer of silicon oxy-nitride. Namely, the native oxide layer 131 is completely converted to the silicon oxy-nitride layer 132 using the aforementioned operations.

In some embodiments, the gate structure 120 has an aspect ratio substantially greater than 0% and smaller than or equal to 40%, in which the aspect ratio is the ratio of a width x of the gate structure 120 to a height y thereof. As described above, the laminated sacrificial oxide layer 130 is not formed by deposition but by using a reactive gas to convert a portion of the native oxide layer 131 to the silicon oxy-nitride layer 132. If the laminated sacrificial oxide layer 130 is formed by using a deposition process, it is required to consider the problem of step coverage under a smaller aspect ratio of the gate structure 120. In contrast, when the laminated sacrificial oxide layer 130 is formed using the reactive gas, the native oxide layer 131 is first formed uniformly in thickness of about several or dozens of angstroms because the silicon atoms of the silicon-based substrate 110 are reacted with oxide atoms in an air or oxygen atmosphere. Therefore, when the native oxide layer 131 (or a portion of the native oxide layer 131) is converted to the silicon oxy-nitride layer 132 using the reactive gas, the silicon oxy-nitride layer 132 (or the combinations of the remaining native oxide layer 131 and the silicon oxy-nitride layer 132) is also formed uniformly in thickness. Thus, the gate structure 120 may have a smaller aspect ratio without needing to consider the problem of step coverage. In some embodiments, the gate structure 120 may also have a larger aspect ratio.

In some embodiments, the aforementioned second portion 130b of the laminated sacrificial oxide layer 130 may have a top corner angle θ greater than about 0 and smaller than or equal to about 90 degrees. As described above, the laminated sacrificial oxide layer 130 may be formed by using a reactive gas to convert the native oxide layer 131 (or a portion of the native oxide layer 131) to the silicon oxy-nitride layer 132. Further, a top corner 133 of the second portion 130b can be reduced by the reactive gas. In some embodiments, the top corner angle θ is reduced from a right angle to an acute angle, which is advantageous to the quality of fabricating the semiconductor device 110.

In some embodiments, the semiconductor device 100 may include an implanted region 140 below the first portion 130a.

The implanted region 140, such as source/drain regions, n-well or p-well, is formed by an implanting operation, and then the ions are homogenized in the silicon-based substrate 110 using a rapid thermal annealing operation. At the implanting operation, ions are implanted into the silicon-based substrate 110 through the silicon oxy-nitride layer 132 (or the combinations of the remaining native oxide layer 131 and the silicon oxy-nitride layer 132). Because the laminated sacrificial oxide layer 130 has a uniform thickness, the depth of the ions in the silicon-based substrate 110 can be easily controlled. Further, the ions may be implanted into the silicon-based substrate 110 at a tilt angle between moving direction of the ions and the silicon silicon-based substrate 110, so as to avoid the channel effect. In some embodiments, the ions may be reflected by the second portion 130b of the laminated sacrificial oxide layer 130. Because the first thickness r1 of the first portion 130a is substantially the same as the second thickness r2 of the second portion 130b, it is advantageous to control the stability of implanting the ions.

Figure 2:
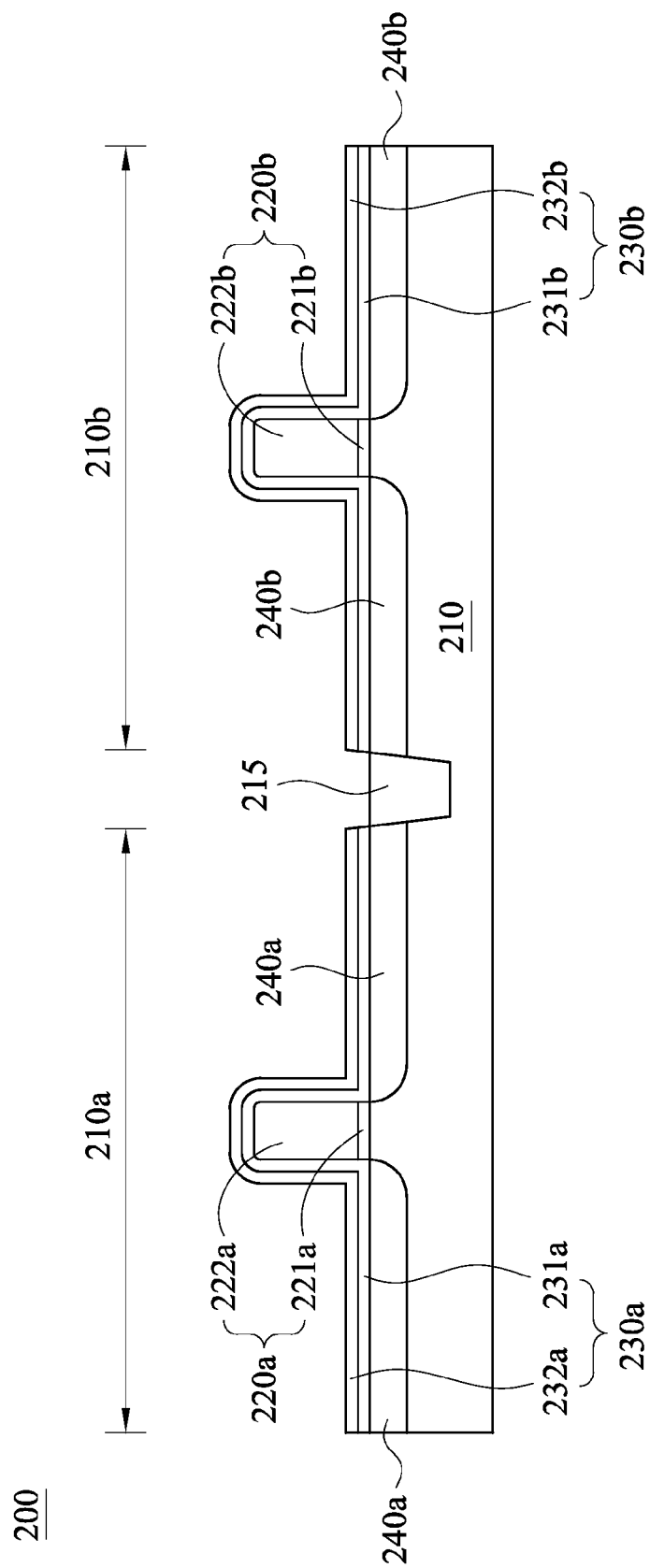
FIG. 2 is a schematic cross-sectional diagram of a semiconductor device in accordance with certain embodiments.

FIG. 2 is a schematic cross-sectional diagram of a semiconductor device 200 in accordance with certain embodiments. As shown in FIG. 2, the semiconductor device 200 includes a silicon-based substrate 210 with a first region 210a and a second region 210b, an isolation feature 215, a first gate structure 220a, a second gate structure 220b, a first laminated sacrificial oxide layer 230a, a second laminated sacrificial oxide layer 230b, a first implanted region 240a and a second implanted region 240b. In some embodiments, the semiconductor device 200 may be considered as a device with two semiconductor devices 100 respectively at the first region 210a and the second region 210b, but the first region 210a and the second region 210b are isolated by the isolation feature 215.

In some embodiments, the silicon-based substrate 210 is formed from, for example, pure silicon. Other commonly used materials, such as carbon, germanium, silicon-germanium, gallium, arsenic, nitrogen, indium, phosphorus, and/or the like, may also be included in the silicon-based substrate 210. The silicon-based substrate 210 may be formed from a single-crystalline silicon-based material or compound silicon-based materials, and may be a bulk substrate or a semiconductor-on-insulator (SOI) substrate.

In some embodiments, the isolation feature 215 including, such as a silicon oxide, a trench isolation, a silicon dioxide or a field oxide (FOX), is disposed in the silicon-based substrate 210 to isolate the first region 210a from the second region 210b. In some embodiments, some isolation features 215 may be shallow trench isolations (STIs) used to separate and isolate photo diodes, memory cells or SRAM cells in an array area, and some isolation features 215 may be deep trench isolations used to separate and isolate NMOS and PMOS devices in a peripheral area. The structures, materials, depth of the STI and the deep trench isolations can be different in different areas. Specific STI profile and material may be needed for meeting certain device requirements.

In some embodiments, the first gate structure 220a may include a first gate dielectric layer 221a and a first gate electrode 222a, and the second gate structure 220b may include a second gate dielectric layer 221b and a second gate electrode 222b. The first gate dielectric layer 221a and the second gate dielectric layer 221b include a dielectric material, such as silicon oxide, high-k dielectric material, silicon-based material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina alloy, other suitable high-k dielectric materials, and/or combinations thereof.

The first gate electrode 222a and the second gate electrode 222b include polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The first gate structure 220a and the second gate structure 220b may include numerous other layers, for example, capping layers, interface layers, diffusion layers, barrier layers, or combinations thereof. The first gate structure 220a and the second gate structure 220b may be formed by a process including deposition, lithography patterning, and/or etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable lithography patterning processes, or combinations thereof. Alternatively, the lithography patterning process is implemented or replaced by other methods, such as maskless photolithography, electron-beam writing, and/or ion-beam writing. In alternative embodiments, the lithography patterning process could implement nanoimprint technology. The etching processes include dry etching, wet etching, and/or other etching methods.

In some embodiments, the first laminated sacrificial oxide layer 230a includes a first native oxide layer 231a and a first silicon oxy-nitride layer 232a. The first native oxide layer 231a is formed on the silicon-based substrate 210 and conformal to the first gate structure 220a, and the first silicon oxy-nitride layer 232a is conformal to the first native oxide layer 231a. The second laminated sacrificial oxide layer 230b includes a second native oxide layer 231b and a second silicon oxy-nitride layer 232b. The second native oxide layer 231b is formed on the silicon-based substrate 210 and conformal to the second gate structure 220b, and the second silicon oxy-nitride layer 232b is conformal to the second native oxide layer 231b. In some embodiments, the first laminated sacrificial oxide layer 230a and the second laminated sacrificial oxide layer 230b are used to protect the silicon-based substrate 210 when the first implanted region 240a and the second implanted region 240b are being formed by implanting operations.

Figure 3A:
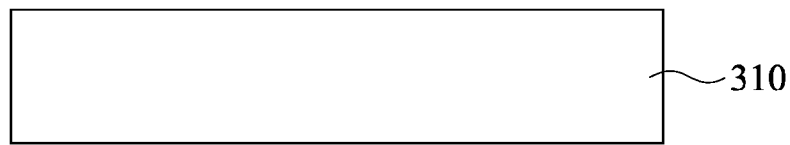
FIG. 3A-3E are schematic cross-sectional views of intermediate stages showing a method for fabricating a semiconductor device in accordance with some embodiments.

FIG. 3A-3E are schematic cross-sectional views of intermediate stages showing a method for fabricating a semiconductor device 300 in accordance with some embodiments. As shown in FIG. 3A, a silicon-based substrate 310 is provided. In some embodiments, the silicon-based substrate 310 may be formed from the materials similar to the materials forming the silicon-based substrate 110.

Figure 3B:
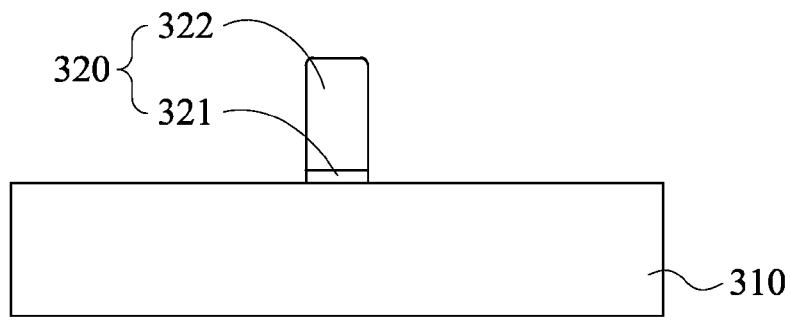

As shown in FIG. 3B, a gate structure 320 is formed on the silicon-based substrate 310 and may include a gate dielectric layer 321 and a gate electrode 322. In some embodiments, the gate dielectric layer 321 and the gate electrode 322 may be formed respectively from the materials similar to the materials forming the gate dielectric layer 121 and the gate electrode 122.

Figure 3C:
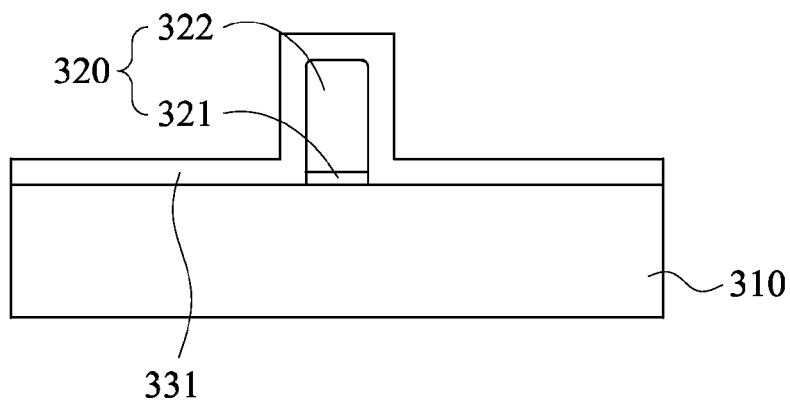

As shown in FIG. 3C, a native oxide layer 331 is formed on the silicon-based substrate 310 and conformal to the gate structure 320. In some embodiments, the native oxide layer 331 is formed by exposing the silicon-based substrate 310 and the gate structure 320 in an air or oxygen atmosphere.

Figure 3D:
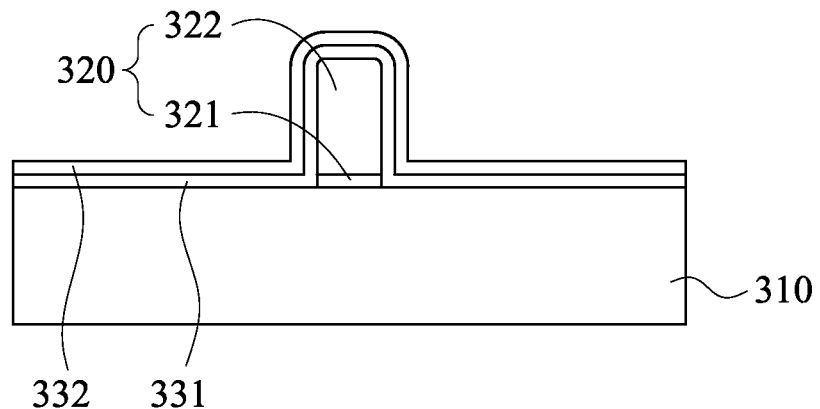

As shown in FIG. 3D, the native oxide layer 331 is converted to a silicon oxy-nitride layer 332 using a reactive gas, such as hydrogen gas (or oxygen gas) and nitrogen gas. The hydrogen gas (or the oxygen gas) is used to break the bonding between silicon atoms and oxide atoms of the native oxide layer, and the nitrogen gas is used to provide nitrogen atoms for the native oxide layer to be converted to the silicon oxy-nitride layer 332. In certain embodiments, the native oxide layer 331 may be partly or completely converted to the silicon oxy-nitride layer 332.

In some embodiments, the reactive gas with a flow rate ratio of the hydrogen gas to the nitrogen gas is in a range from 0.01 to 2.5, and the thickness of the silicon oxy-nitride layer 332 is in a range from 10 angstroms to 22 angstroms. In certain embodiments, if the flow rate ratio of the hydrogen gas to the nitrogen gas is smaller, the thickness of the silicon oxy-nitride layer 332 is larger. For example, when the flow rate ratio of the hydrogen gas to the nitrogen gas is about 1.5, the thickness of the silicon oxy-nitride layer 332 is 15 angstroms; when the flow rate ratio of the hydrogen gas to the nitrogen gas is about 0.01, the thickness of the silicon oxy-nitride layer 332 is 22 angstroms.

Figure 3E:
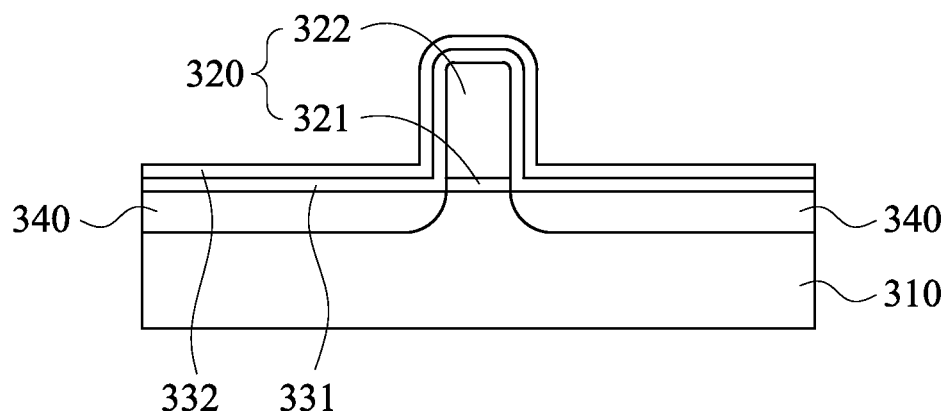

As shown in FIG. 3E, ions are implanted into the silicon-based substrate 310 through the silicon oxy-nitride layer 332 to form an implanted region 340 in the silicon-based substrate 310. In some embodiments, if the native oxide layer 331 is not completely converted to the silicon oxy-nitride layer 332, the ions are implanted into the silicon-based substrate 310 through the native oxide layer 331 and the silicon oxy-nitride layer 332. In certain embodiments, the ions in the silicon-based substrate 310 may be homogenized by using a rapid thermal annealing operation.

Figure 4C:
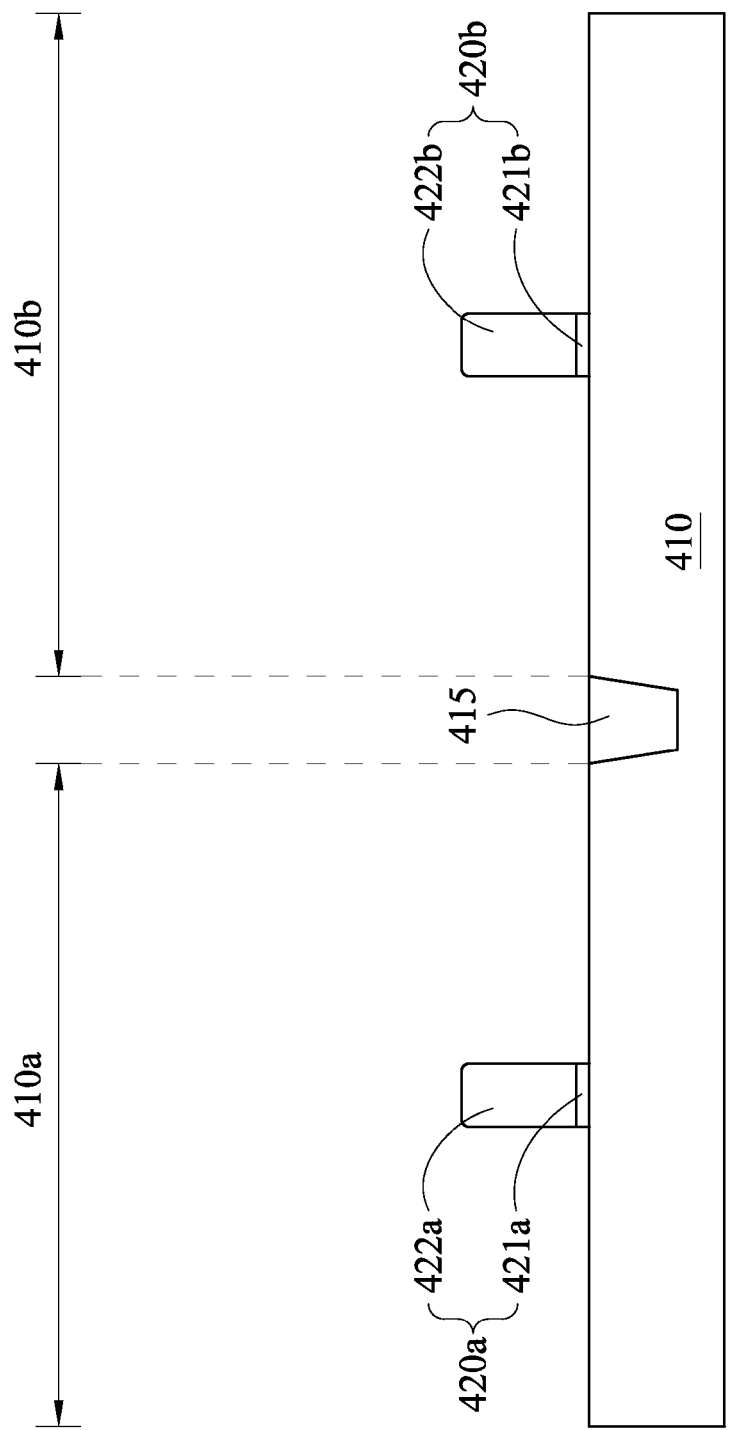

FIG. 4A-4M are schematic cross-sectional views of intermediate stages showing a method for fabricating a semiconductor device 400 in accordance with certain embodiments. As shown in FIG. 4A, a silicon-based substrate 410 with a first region 410a and a second region 410b is provided. In some embodiments, the silicon-based substrate 410 may be formed from the materials similar to the materials forming the silicon-based substrate 210.

As shown in FIG. 4B, an isolation feature 415 is formed in the silicon-based substrate 410 to isolate the first region 410a from the second region 410b. In some embodiments, the isolation feature 415 including, such as a silicon oxide, a trench isolation, a silicon dioxide or a field oxide (FOX), is disposed in the silicon-based substrate 410 to isolate the first region 410a from the second region 410b. In some embodiments, some isolation features 415 may be shallow trench isolations (STIs) used to separate and isolate photo diodes, memory cells or SRAM cells in an array area, and some isolation features 415 may be deep trench isolations used to separate and isolate NMOS and PMOS devices in a peripheral area. The structures, materials, depth of the STI and the deep trench isolations can be different in different areas. Specific STI profile and material may be needed for meeting certain device requirements.

As shown in FIG. 4C, a first gate structure 420a and a second gate structure 420b are formed respectively on the first region 410a and the second region 410b. In some embodiments, the first gate structure 420a may include a first gate dielectric layer 421a and a first gate electrode 422a, and the second gate structure 420b may include a second gate dielectric layer 421b and a second gate electrode 422b. The first gate electrode 422a and the second gate electrode 422b are respectively formed on the first gate dielectric layer 421a and the second gate dielectric layer 421b. In some embodiments, the first gate dielectric layer 421a and the second gate dielectric layer 421b may be formed together at the same operation and may be also formed individually in different operations. In certain embodiments, the first gate electrode 422a and the second gate electrode 422b may be formed together at the same operation, or may be formed individually in different operations.

Figure 4D:
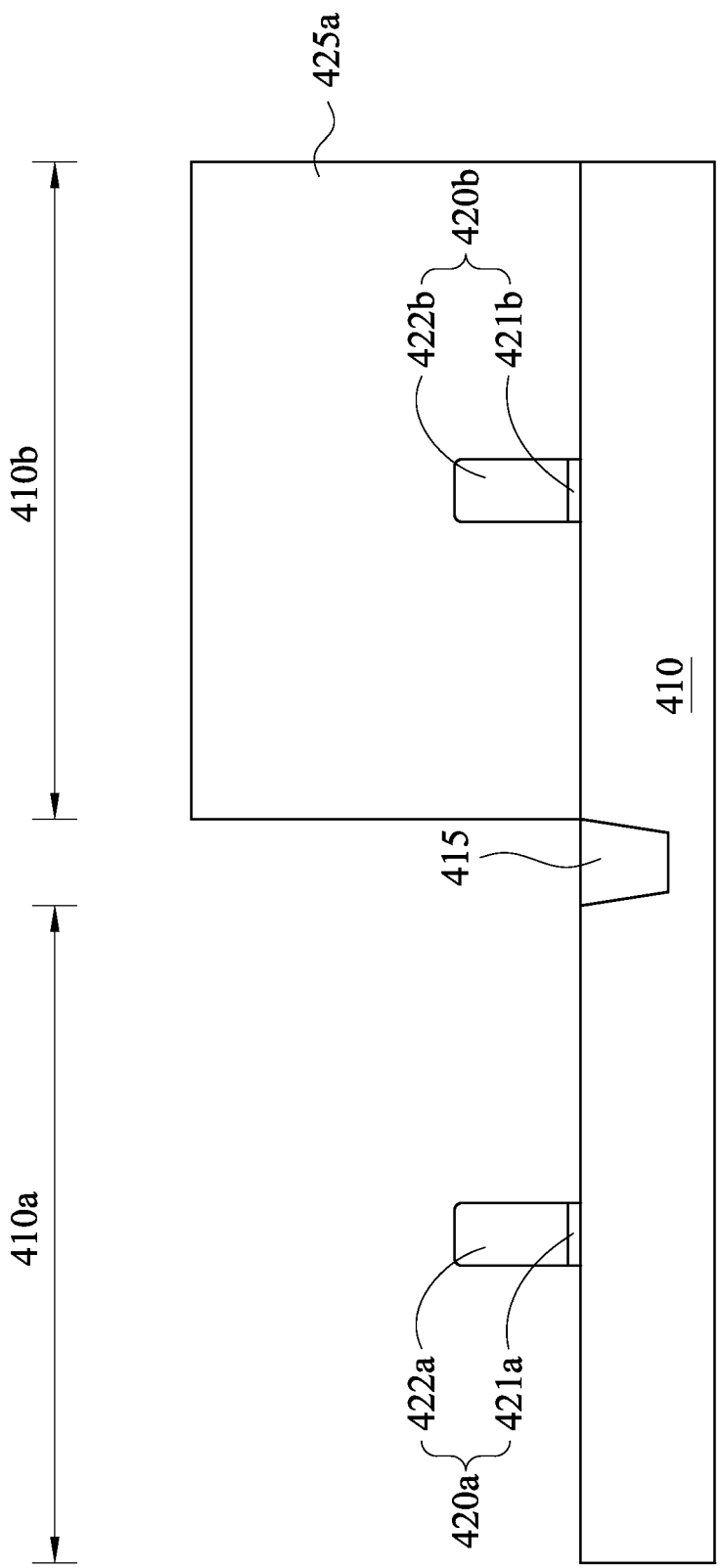

As shown in FIG. 4D, a first resist layer 425a is formed on the second region 410b. In some embodiments, the first resist layer 425a may be first formed to cover the first region 410a and the second region 410b of the silicon-based substrate 410, and then the first resist layer 425a on the first region 410a is removed by using a drying etching operation.

Figure 4E:
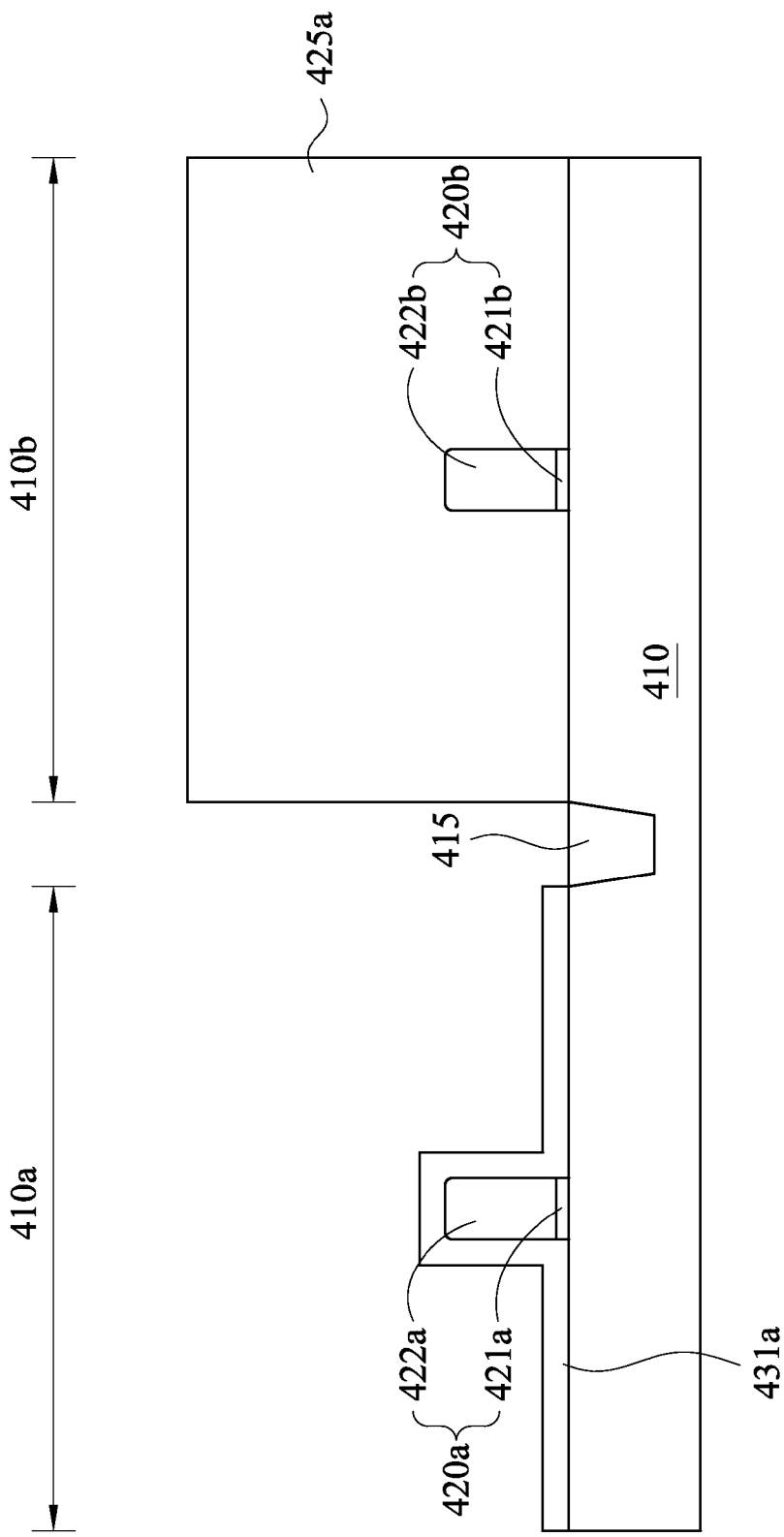

As shown in FIG. 4E, a first native oxide layer 431a is formed on the first region 410a and conformal to the first gate structure 420a. In some embodiments, the first native oxide layer 431a is formed by exposing the first region 410a and the first gate structure 420a in an air or oxygen atmosphere. It is noted that, the first native oxide layer 431a is formed after the aforementioned drying etching operation is performed, and thus the first native oxide layer 431a is not damaged by the drying etching operation.

Figure 4F:
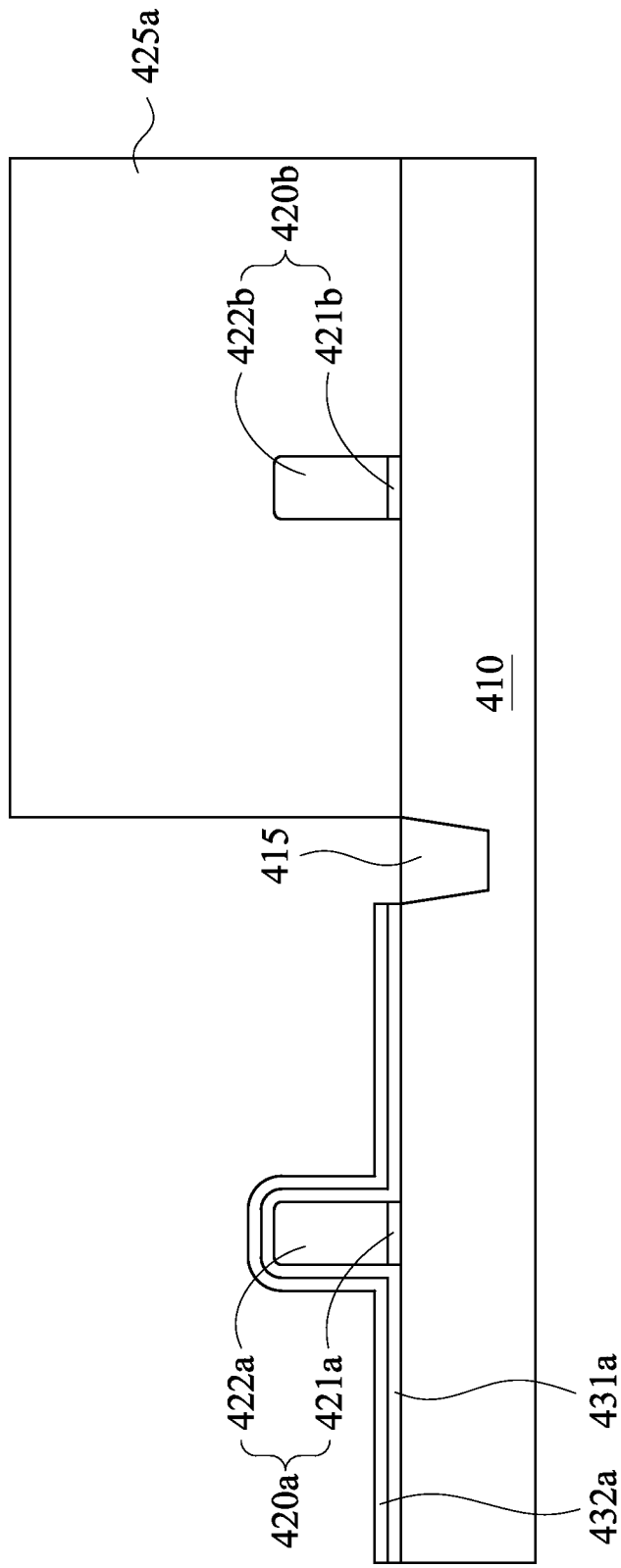

As shown in FIG. 4F, a reactive gas, such as hydrogen gas (or oxygen gas) and nitrogen gas, is used to convert the first native oxide layer 431a to a first silicon oxy-nitride layer 432a. The hydrogen gas (or the oxygen gas) is used to break the bonding between silicon atoms and oxide atoms of the first native oxide layer 431a, and the nitrogen gas is used to provide nitrogen atoms for the first native oxide layer 431a, and thus the first native oxide layer 431a is converted to the silicon oxy-nitride layer 432a. It is noted that the first silicon oxy-nitride layer 432a is formed after the aforementioned drying etching operation is performed, and thus the first silicon oxy-nitride layer 432a is not damaged by the drying etching operation. In certain embodiments, the first native oxide layer 431a may be partly or completely converted to the first silicon oxy-nitride layer 432a.

In some embodiments, the reactive gas with a flow rate ratio of the hydrogen gas to the nitrogen gas is in a range from 0.01 to 2.5, and the thickness of the first silicon oxy-nitride layer 432a is in a range from 10 angstroms to 22 angstroms. In certain embodiments, if the flow rate ratio of the hydrogen gas to the nitrogen gas is smaller, the thickness of the first silicon oxy-nitride layer 432a is larger. For example, when the flow rate ratio of the hydrogen gas to the nitrogen gas is about 1.5, the thickness of the first silicon oxy-nitride layer 432a is 15 angstroms; when the flow rate ratio of the hydrogen gas to the nitrogen gas is about 0.01, the thickness of the first silicon oxy-nitride layer 432a is 22 angstroms. Therefore, the thickness of the first silicon oxy-nitride layer 432a may be controlled by the flow rate ratio of the hydrogen gas to the nitrogen gas.

As shown in FIG. 4G, first ions are implanted into the first region 410a through the first silicon oxy-nitride layer 432a to form the first implanted region 440a. In some embodiments, if the first native oxide layer 431a is not completely converted to the first silicon oxy-nitride layer 432a, the first ions are implanted into the silicon-based substrate 410 through the first native oxide layer 431a and the first silicon oxy-nitride layer 432a. After the first implanted region 440a is formed, the first resist layer 425a is removed, as shown in FIG. 4H.

Figure 4I:
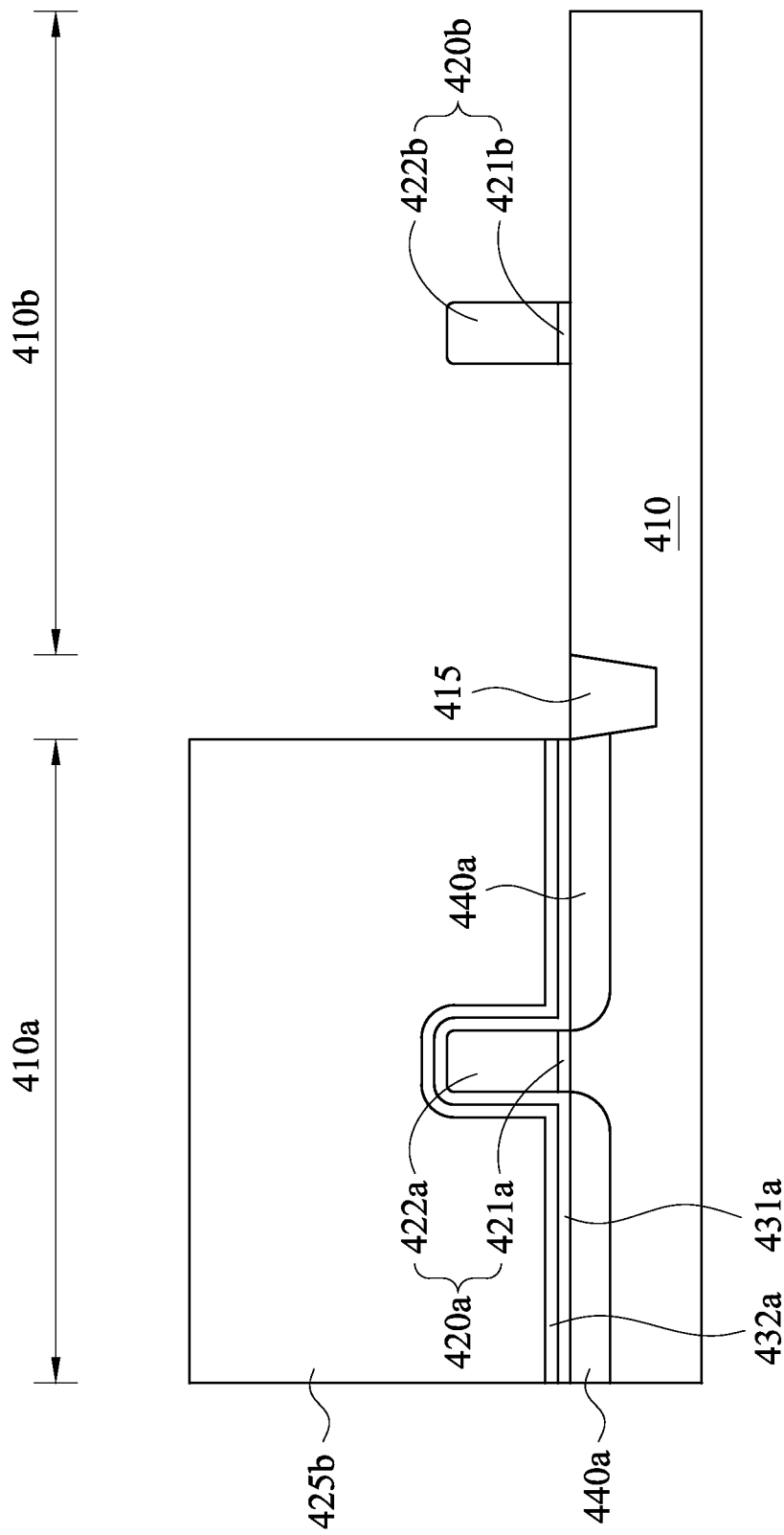

As shown in FIG. 4I, a second resist layer 425b is formed on the first silicon oxy-nitride layer 432a. In some embodiments, the second resist layer 425b may be first formed to cover the second region 410b and the first silicon oxy-nitride layer 432a, and then the second resist layer 425b on the second region 410b is removed by using a drying etching operation.

Figure 4J:
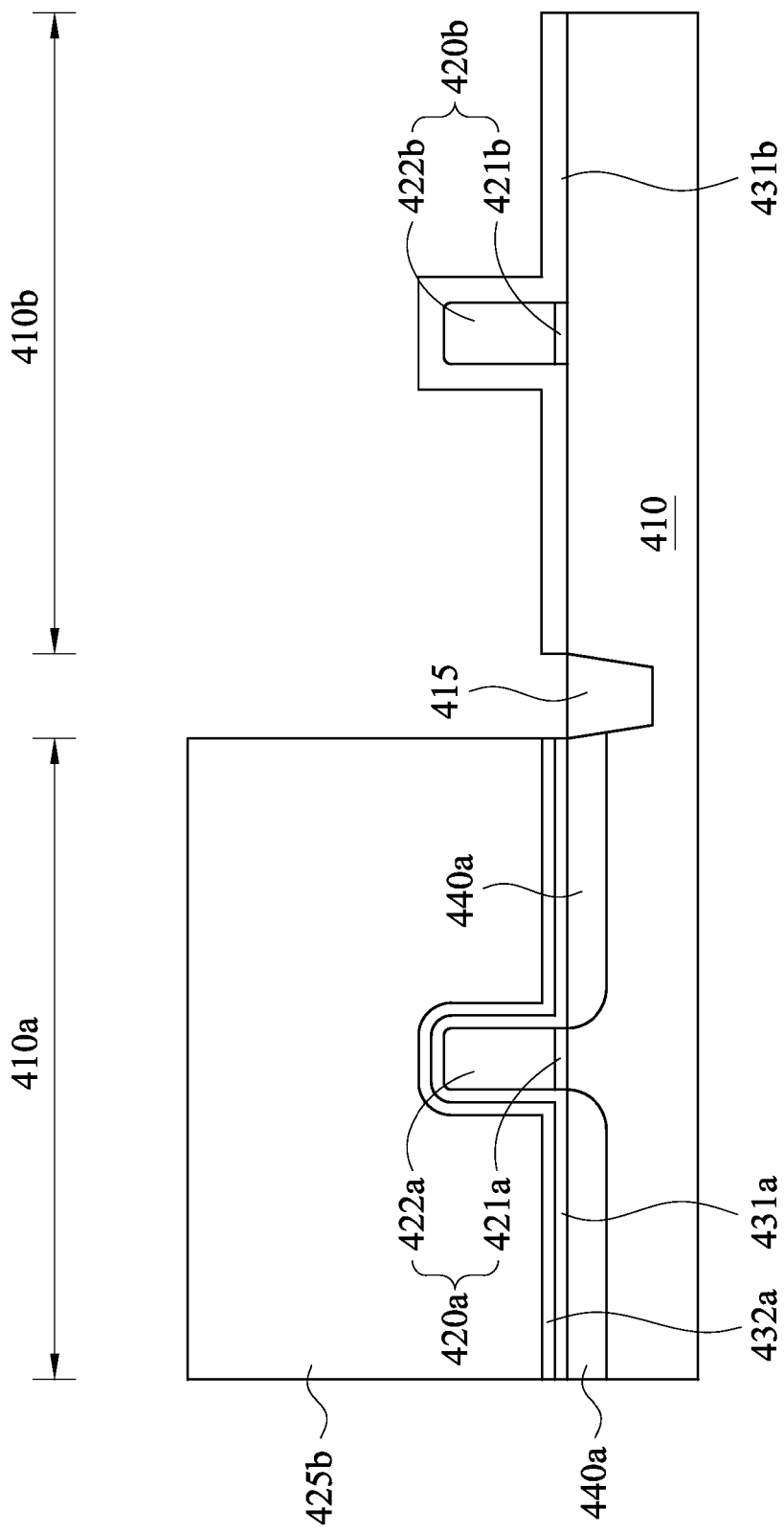

As shown in FIG. 4J, a second native oxide layer 431b is formed on the second region 410b and conformal to the second gate structure 420b. In some embodiments, the second native oxide layer 431b is formed by exposing the second region 410b and the second gate structure 420b in an air or oxygen atmosphere. It is noted that, the second native oxide layer 431b is formed after the aforementioned drying etching operation is performed, and thus the second native oxide layer 431b is not damaged by the drying etching operation.

Figure 4K:
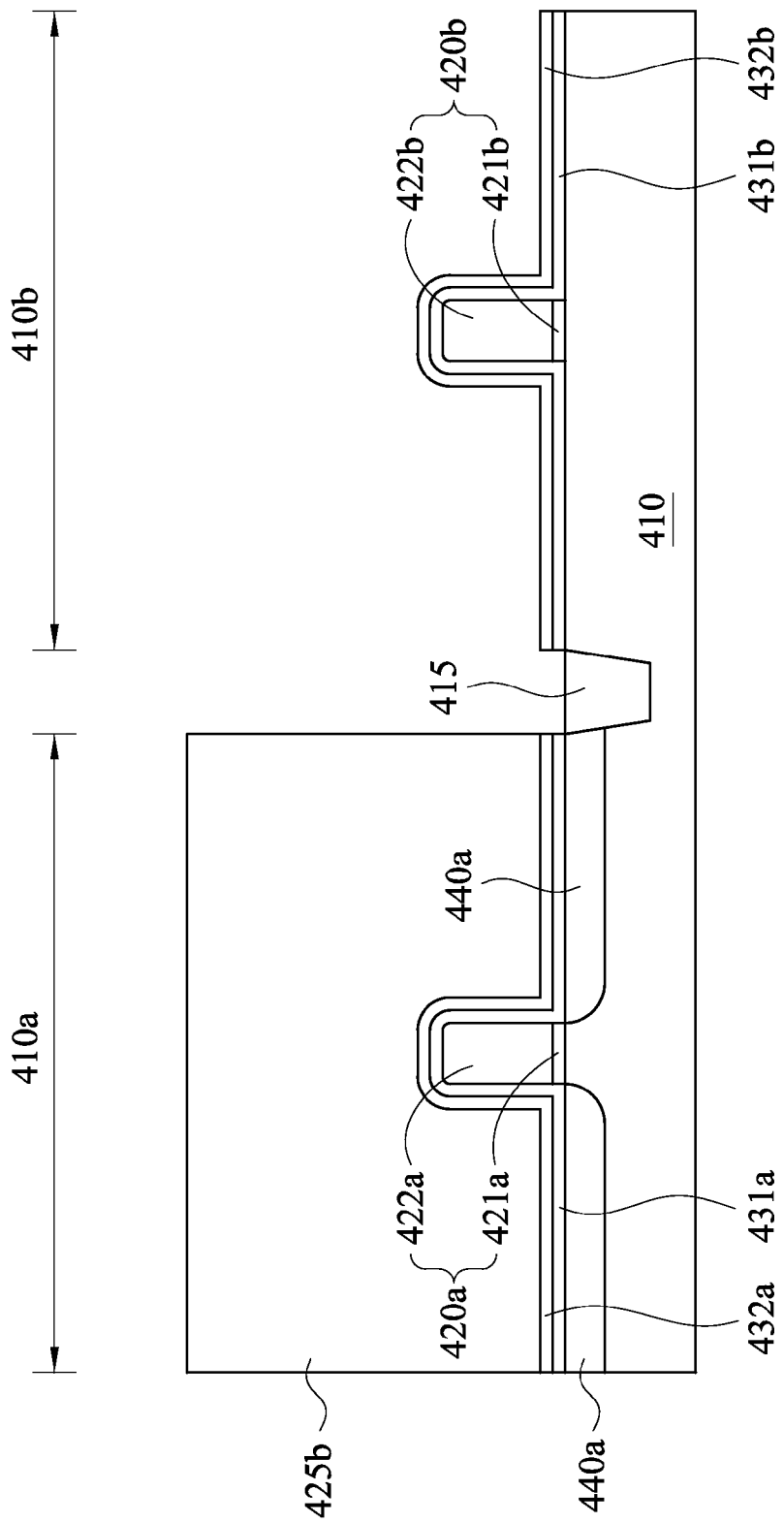

As shown in FIG. 4K, a reactive gas, such as hydrogen gas (or oxygen gas) and nitrogen gas, is used to convert the second native oxide layer 431b to a second silicon oxy-nitride layer 432b. The hydrogen gas (or the oxygen gas) is used to break the bonding between silicon atoms and oxide atoms of the second native oxide layer 431b, and the nitrogen gas is used to provide nitrogen atoms for the second native oxide layer 431b, therefore the second native oxide layer 431b is converted to the second silicon oxy-nitride layer 432b. It is noted that the second silicon oxy-nitride layer 432b is formed after the aforementioned drying etching operation is performed, and thus the second silicon oxy-nitride layer 432b is not damaged by the drying etching operation. In certain embodiments, the second native oxide layer 431b may be partly or completely converted to the second silicon oxy-nitride layer 432b.

Figure 4L:
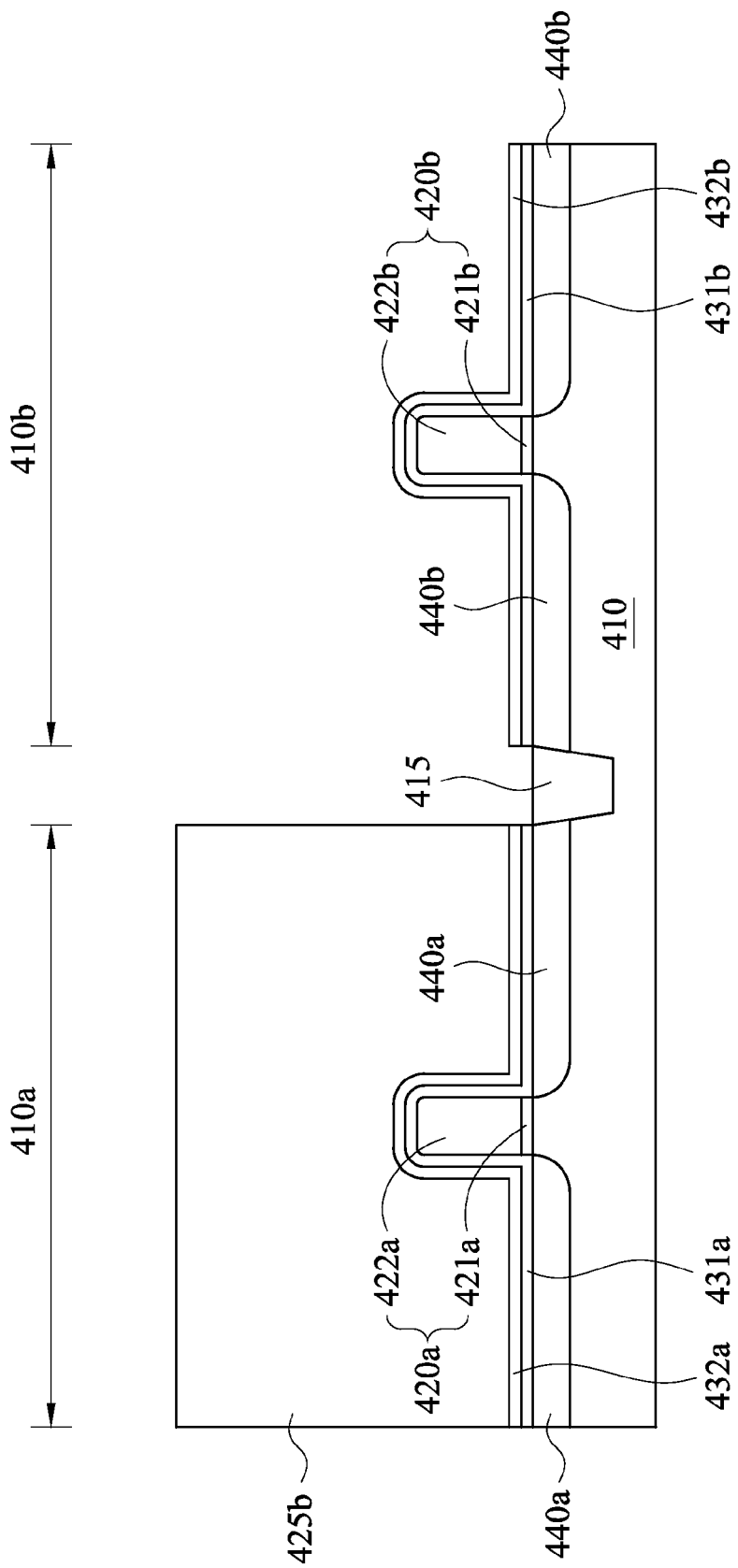
Figure 4M:
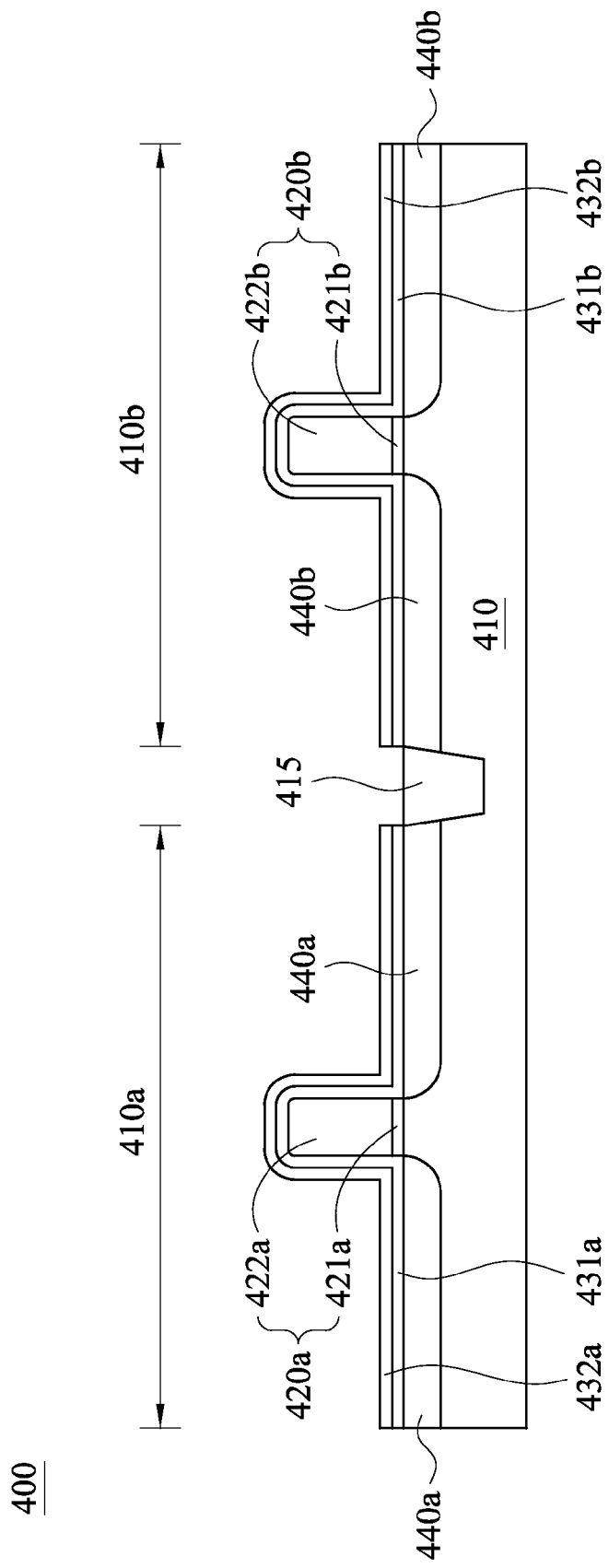

As shown in FIG. 4L, second ions are implanted into the second region 410b through the second silicon oxy-nitride layer 432b to form the second implanted region 440b. In some embodiments, if the second native oxide layer 431b is not completely converted to the second silicon oxy-nitride layer 432b, the second ions are implanted into the silicon-based substrate 410 through the second native oxide layer 431b and the second silicon oxy-nitride layer 432b. After the second implanted region 440b is formed, the second resist layer 425b is removed, as shown in FIG. 4M.

In some embodiments, after the first ions and the second ions are implanted into the silicon-based substrate 410, the first ions and the second ions may be homogenized by using a rapid thermal annealing operation.

Figure 5:
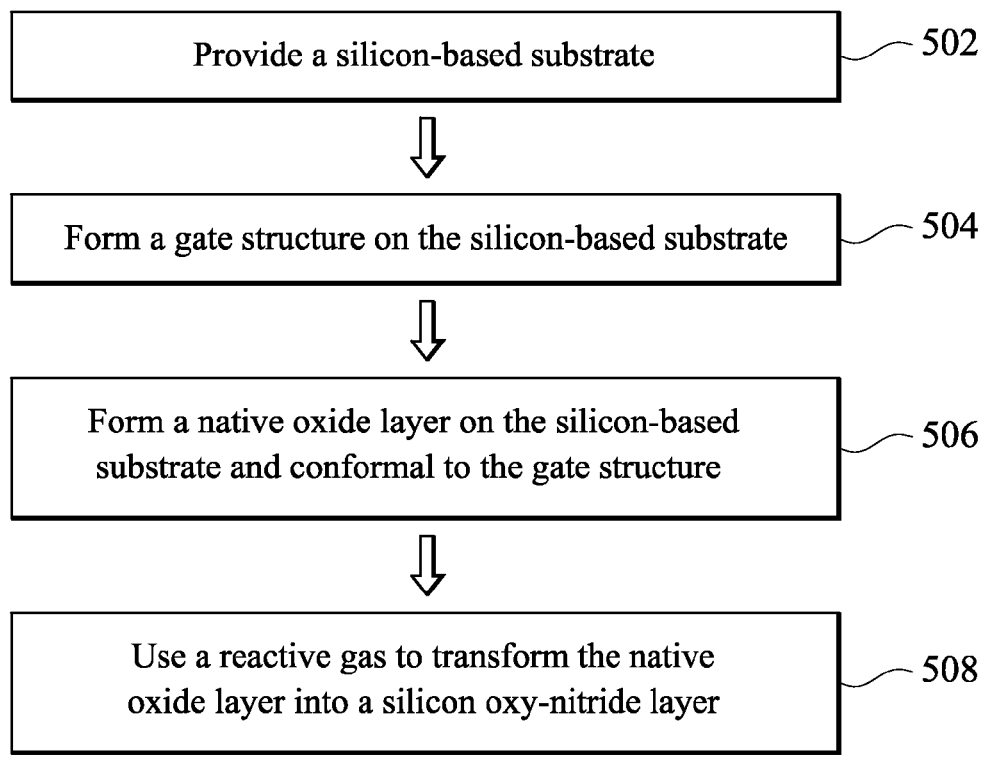
FIG. 5 is a flow chart of a method for fabricating a semiconductor device in accordance with some embodiments.

Referring to FIG. 5 together with FIG. 3A-FIG. 3D, FIG. 5 is a flow chart of a method 500 for fabricating a semiconductor device in accordance with some embodiments. The method 500 begins at operation 502, where a silicon-based substrate 310 is provided, as shown in FIG. 3A. At operation 504, a gate structure 320 is formed on the silicon-based substrate 310, as shown in FIG. 3B. At operation 506, a native oxide layer 331 is formed on the silicon-based substrate 310 and conformal to the gate structure 320, as shown in FIG. 3C. At operation 508, a reactive gas is used to convert the native oxide layer 331 to a silicon oxy-nitride layer, as shown in FIG. 3D.

Figure 6:
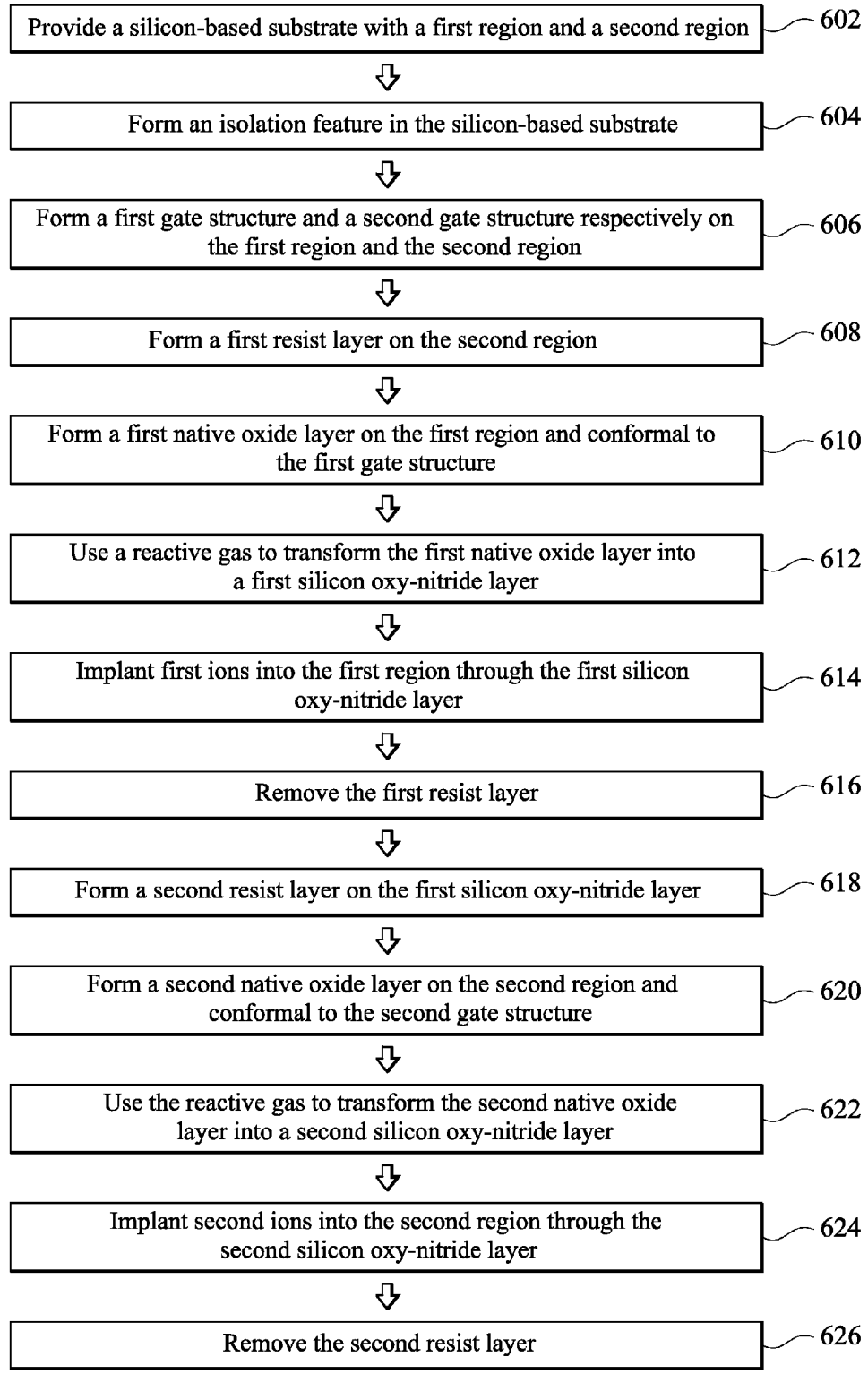
FIG. 6 is a flow chart of a method for fabricating a semiconductor device in accordance with various embodiments.

Referring to FIG. 6 together with FIG. 4A-FIG. 4M, FIG. 6 is a flow chart of a method 600 for fabricating a semiconductor device in accordance with various embodiments. The method 600 begins at operation 602, where a silicon-based substrate 410 is provided and has a first region 410a and a second region 410b, as shown in FIG. 4A. At operation 604, an isolation feature 415 is formed in the silicon-based substrate 410 to isolate the first region 410a from the second region 410b, as shown in FIG. 4B. At operation 606, a first gate structure 420a and a second gate structure 420b are formed respectively on the first region 410a and the second region 410b, as shown in FIG. 4C. At operation 608, a first resist layer 425a is formed on the second region 410b, as shown in FIG. 4D. At operation 610, a first native oxide layer 431a is formed on the first region 410a and conformal to the first gate structure 420a, as shown in FIG. 4E. At operation 612, a reactive gas is used to convert the first native oxide layer 431a to a first silicon oxy-nitride layer 432a, as shown in FIG. 4F. At operation 614, first ions are implanted into the first region 410a through the first silicon oxy-nitride layer 432a, as shown in FIG. 4G. At operation 616, the first resist layer 425a is removed, as shown in FIG. 4H. At operation 618, a second resist layer 425b is formed on the first silicon oxy-nitride layer 432a, as shown in FIG. 4I. At operation 620, a second native oxide layer 431b is formed on the second region 410b and conformal to the second gate structure 420b, as shown in FIG. 4J. At operation 622, the reactive gas is used to convert the second native oxide layer 431b to a second silicon oxy-nitride layer 432b, as shown in FIG. 4K. At operation 624, second ions are implanted into the second region 410b through the second silicon oxy-nitride layer 432b, as shown in FIG. 4L. At operation 626, the second resist layer 425b is removed, as shown in FIG. 4M.

In accordance with some embodiments, the present disclosure discloses a semiconductor device. The semiconductor device includes a silicon-based substrate, a gate structure and a laminated sacrificial oxide layer. The gate structure is on the silicon-based substrate. The laminated sacrificial oxide layer has a first portion on the silicon-based substrate and a second portion conformal to the gate structure, in which a first thickness of the first portion is substantially the same as a second thickness of the second portion. The laminated sacrificial oxide layer includes a native oxide layer and a silicon oxy-nitride layer. The native oxide layer is on the silicon-based substrate and conformal to the gate structure. The silicon oxy-nitride layer is conformal to the native oxide layer.

In accordance with certain embodiments, the present disclosure discloses a method for fabricating a semiconductor device. In this method, a silicon-based substrate is provided. A gate structure is formed on the silicon-based substrate. A native oxide layer is formed on the silicon-based substrate and conformal to the gate structure. A reactive gas is used to convert the native oxide layer to a silicon oxy-nitride layer.

In accordance with alternative embodiments, the present disclosure discloses a method for fabricating a semiconductor device. In this method, a silicon-based substrate with a first region and a second region is provided. An isolation feature is formed in the silicon-based substrate to isolate the first region from the second region. A first gate structure and a second gate structure are formed respectively on the first region and the second region. A first resist layer is formed on the second region. A first native oxide layer is formed on the first region and conformal to the first gate structure. A reactive gas is used to convert the first native oxide layer to a first silicon oxy-nitride layer. First ions are implanted into the first region through the first silicon oxy-nitride layer. The first resist layer is removed. A second resist layer is formed on the first silicon oxy-nitride layer. A second native oxide layer is formed on the second region and conformal to the second gate structure. The reactive gas is used to convert the second native oxide layer to a second silicon oxy-nitride layer. Second ions are implanted into the second region through the second silicon oxy-nitride layer. The second resist layer is removed.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating a semiconductor device, the method comprising
providing a silicon-based substrate;
forming a gate structure on the silicon-based substrate;
forming a native oxide layer on the silicon-based substrate and conformal to the gate structure; and
using a reactive gas to convert the native oxide layer to a silicon oxy-nitride layer.

2. The method of claim 1, wherein the reactive gas comprises hydrogen gas and nitrogen gas.

3. The method of claim 2, wherein a flow rate ratio of the hydrogen gas to the nitrogen gas is substantially in a range from 0.01 to 2.5.

4. The method of claim 1, wherein the reactive gas comprises oxygen gas and nitrogen gas.

5. The method of claim 1, further comprising implanting ions into the silicon-based substrate through the silicon oxy-nitride layer after the operation of providing the reactive gas to convert the native oxide layer to the silicon oxy-nitride layer is performed.

6. The method of claim 5, further comprising using a rapid thermal annealing operation to homogenize the ions in the silicon-based substrate after the operation of implanting ions into the silicon-based substrate is performed.

7. The method of claim 1, wherein the operation of forming the native oxide layer on the silicon-based substrate and conformal to the gate structure comprises forming the native oxide layer by exposing the silicon-based substrate and the gate structure in an air or oxygen atmosphere.

8. The method of claim 1, wherein the operation of using the reactive gas to convert the native oxide layer to the silicon oxy-nitride layer comprises partly converting the native oxide layer to the silicon oxy-nitride layer and remaining a portion of the native oxide layer, wherein the silicon oxy-nitride layer is conformal to the portion of the native oxide layer, and the silicon oxy-nitride layer and the portion of the native oxide layer form a laminated sacrificial oxide layer.

9. The method of claim 8, wherein the laminated sacrificial oxide layer has a first portion on the silicon-based substrate and a second portion conformal to the gate structure, and a first thickness of the first portion is substantially the same as a second thickness of the second portion.

10. The method of claim 9, wherein the first thickness and the second thickness are substantially in a range from 10 angstroms to 22 angstroms.

11. The method of claim 9, wherein the second portion of the laminated sacrificial oxide layer has a top corner angle substantially greater than 0 and smaller than or equal to 90 degrees.

12. The method of claim 1, wherein the operation of using the reactive gas to convert the native oxide layer to the silicon oxy-nitride layer comprises completely converting the native oxide layer to the silicon oxy-nitride layer.

13. A method for fabricating a semiconductor device, the method comprising
providing a silicon-based substrate with a first region and a second region;

forming an isolation feature in the silicon-based substrate to isolate the first region from the second region;

forming a first gate structure and a second gate structure respectively on the first region and the second region;

forming a first resist layer on the second region;

forming a first native oxide layer on the first region and conformal to the first gate structure;

using a reactive gas to convert the first native oxide layer to a first silicon oxy-nitride layer;

implanting first ions into the first region through the first silicon oxy-nitride layer;

removing the first resist layer;

forming a second resist layer on the first silicon oxy-nitride layer;

forming a second native oxide layer on the second region and conformal to the second gate structure;

using the reactive gas to convert the second native oxide layer to a second silicon oxy-nitride layer;

implanting second ions into the second region through the second silicon oxy-nitride layer; and removing the second resist layer.

14. The method of claim 13, further comprising using a rapid thermal annealing operation to homogenize the first ions in the first region and the second ions in the second region after the operation removing the second resist layer.

15. The method of claim 13, wherein the reactive gas comprises hydrogen gas and nitrogen gas.

16. The method of claim 15, wherein a flow rate ratio of the hydrogen gas to the nitrogen gas is substantially in a range from 0.01 to 2.5.

17. The method of claim 13, wherein the reactive gas comprises oxygen gas and nitrogen gas.

18. The method of claim 13, wherein the operation of forming the first resist layer on the second region comprises:
   forming the first resist layer to cover the first region and the second region; and
   removing the first resist on the first region using a drying operation.

19. The method of claim 13, wherein the operation of forming the first native oxide layer on the first region and conformal to the first gate structure comprises forming the first native oxide layer by exposing the first region and the first gate structure in an air or oxygen atmosphere.

20. The method of claim 13, wherein
   the operation of using the reactive gas to convert the first native oxide layer to the first silicon oxy-nitride layer comprises partly converting the first native oxide layer to the first silicon oxy-nitride layer and remaining a portion of the first native oxide layer, wherein the first silicon oxy-nitride layer is conformal to the portion of the first native oxide layer; and
   the operation of using the reactive gas to convert the second native oxide layer to the second silicon oxy-nitride layer comprises partly converting the second native oxide layer to the second silicon oxy-nitride layer and remaining a portion of the second native oxide layer, wherein the second silicon oxy-nitride layer is conformal to the portion of the second native oxide layer.

* * * * *